United States Patent [19]
Sugawara

[11] Patent Number: 5,884,150
[45] Date of Patent: Mar. 16, 1999

[54] NONLINEAR COMPENSATING CIRCUIT

[75] Inventor: Hideo Sugawara, Kawasaki, Japan

[73] Assignee: Fujitsu Limited, Kanagawa, Japan

[21] Appl. No.: 669,176

[22] Filed: Jun. 24, 1996

[30] Foreign Application Priority Data

Jan. 12, 1996 [JP] Japan .................................. 8-003870

[51] Int. Cl.⁶ .................................................. H01Q 11/12
[52] U.S. Cl. ......................................... 455/127; 330/149
[58] Field of Search ................................... 455/127, 115; 330/149

[56] References Cited

U.S. PATENT DOCUMENTS

| | | | |
|---|---|---|---|
| 4,670,789 | 6/1987 | Plume | 455/115 X |
| 4,890,300 | 12/1989 | Andrews | 455/115 X |
| 5,221,908 | 6/1993 | Katz et al. | 330/149 |
| 5,361,039 | 11/1994 | Michel | 330/149 |

FOREIGN PATENT DOCUMENTS

| | | |
|---|---|---|
| 47825 | 3/1982 | European Pat. Off. . |
| 289130 | 11/1988 | European Pat. Off. . |
| 522706 | 1/1993 | European Pat. Off. . |
| 524008 | 1/1993 | European Pat. Off. . |
| 576341 | 12/1993 | European Pat. Off. . |
| 1419519 | 12/1975 | United Kingdom . |

*Primary Examiner*—Thomas J. Mullen, Jr.
*Attorney, Agent, or Firm*—Helfgott & Karas, P.C.

[57] ABSTRACT

A nonlinear compensating circuit simplified in structure and reduced in bulk and weight is provided for a microwave-band radio apparatus of which a built-in circuit has a nonlinear input/output characteristic. A parallel circuit composed of linear operating means, which performs a linear operation, and nonlinear operating means, which performs a nonlinear operation, is connected in series with a compensated circuit which is a subject of nonlinear compensation.

7 Claims, 13 Drawing Sheets

NONLINEAR COMPENSATING CIRCUIT

BACKGROUND OF THE INVENTION (1) Field of the Invention

The present invention relates to a nonlinear compensating circuit for a radio apparatus, and more particularly, to a nonlinear compensating circuit for a microwave-band radio apparatus of which a built-in circuit has a nonlinear input/output characteristic.

(2) Description of the Related Art

With recent noticeable expansion of portable telephones, there is a demand for development of small-sized, lightweight devices with low power consumption.

Generally, a power amplifier used in a microwaveband radio apparatus has a characteristic such that its output power is proportional to the input power (i.e., the amplification factor is constant) while the input power is small, but becomes unproportional to the input power when the input power is large, causing a reduction in the amplification factor. Such nonlinearity is observed also in the case of phase; namely, while the input power is small, the output signal shows no phase deviation, but when the input power is large, the phase of the output signal advances or lags relative to that of the input signal. A frequency converter used in a radio apparatus also has a similar characteristic.

A conventional means of eliminating the influence of such nonlinearity is to provide a pre-compensating circuit for a power amplifier or the like of a radio apparatus arranged in a base station. Specifically, a distortion is detected through a comparison between the input and output sides of a power amplifier etc., a distortion-compensating distortion corresponding to the detected value is generated, and the generated distortion is combined or synthesized with the input signal for the power amplifier etc.

For portable telephones, the use of a pre-compensating circuit as mentioned above is not favorable because of its bulk, weight, and cost. Therefore, a large-capacity power amplifier or the like is used instead of additionally providing a pre-compensating circuit so that the power amplifier etc. may be used within a linear operation range even when it is supplied with large power.

In the case of the power amplifier or the like of a radio apparatus arranged in a base station, however, a distortion detecting section, a compensatory distortion generating section, a synthesizing section, etc. must be provided as the pre-compensating circuit, with the result that the apparatus is complicated in structure and is expensive.

Portable telephones equipped with large-capacity power amplifiers etc. are free from inconveniences that may be caused in the case where a pre-compensating circuit is used. However, such a power amplifier etc. inevitably have a large size and consume more power, obstructing reduction in size and weight of the battery. This adverse influence is great since the battery accounts for a large percentage of the bulk and weight of a portable telephone. This problem associated with portable telephones can be resolved if a pre-compensating circuit which is moderate in respect of bulk, weight and cost is available.

SUMMARY OF THE INVENTION

An object of the present invention is to provide a nonlinear compensating circuit which is simple in structure, reduced in bulk and weight, and is inexpensive.

To achieve the above object, there is provided a nonlinear compensating circuit for a radio apparatus of which a built-in circuit has a nonlinear input/output characteristic. The nonlinear compensating circuit comprises a compensated circuit as a subject of nonlinear compensation, linear operating means connected in series with the compensated circuit for performing a linear operation, and nonlinear operating means connected in parallel with the linear operating means for performing a nonlinear operation.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments according to the present invention will be hereinafter described with reference to the drawings.

Figure 1:
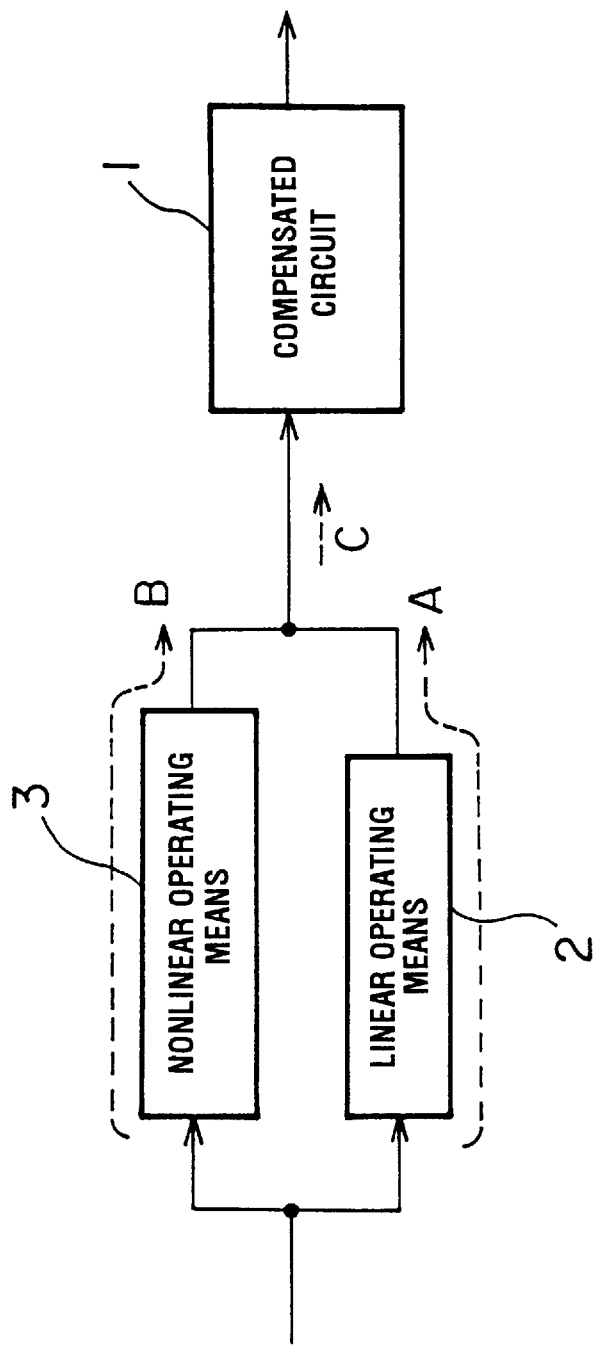
FIG. 1 is a diagram illustrating the principles of the present invention.

Referring first to FIG. 1, a theoretical arrangement according to a first embodiment will be explained. The first embodiment comprises a compensated circuit 1 as a subject of nonlinear compensation, linear operating means 2 connected in series with the compensated circuit 1 for performing a linear operation, and nonlinear operating means 3 connected in parallel with the linear operating means 2 for performing a nonlinear operation.

The operation of a nonlinear compensating circuit constructed as above will be explained with reference to the vector diagram of FIG. 2. To begin with, it is assumed that symbols A, B and C in FIG. 1 represent, respectively, the vector of a signal which has passed through the linear operating means 2, the vector of a signal which has passed through the nonlinear operating means 3, and the vector of a composite signal which is a combination of the above two signals and which is input to the compensated circuit 1. The length of each vector represents the amplitude of a corresponding signal, and the gradient of each vector represents the phase of a corresponding signal.

Figure 2:
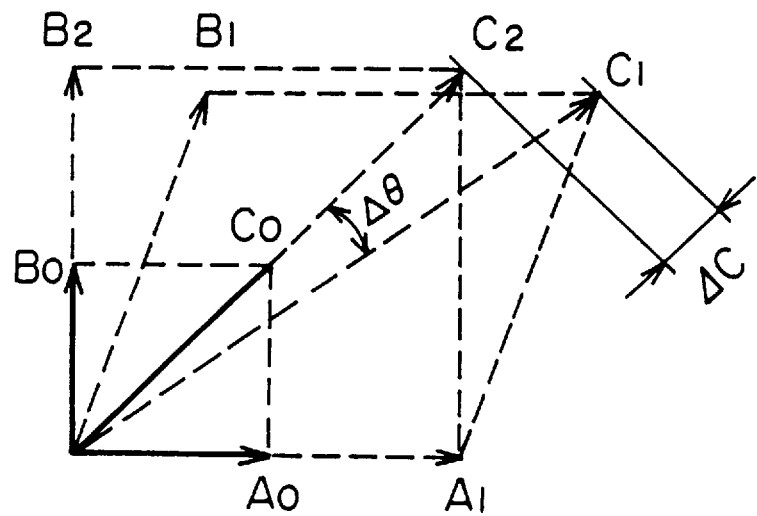
FIG. 2 is a vector diagram corresponding to FIG. 1.

In FIG. 2, the vectors A, B and C during small-signal operation (in which the nonlinear compensating circuit is operated with a small input signal) are indicated particularly at $A_0$, $B_0$ and $C_0$, respectively. By contrast, the vectors A, B and C during large-signal operation (in which the nonlinear compensating circuit is operated with a large input signal) are indicated particularly at $A_1$, $B_1$ and $C_1$, respectively. As the input signal increases in value, only the amplitude of the vector $A_0$ increases in proportion to the input signal up to the vector $A_1$ while the phase of the same vector remains unchanged. On the other hand, the vector $B_0$ changes to the vector $B_1$ due to a nonlinear increase in amplitude and also due to a change in phase. Symbol $B_2$ indicates a vector plotted on the assumption that the vector $B_0$ increases only in amplitude in proportion to (namely, linearly with respect to) the input signal while the phase thereof remains unchanged, and $C_2$ indicates the resultant of the vectors $B_2$ and $A_1$. Compared with the resultant vector $C_2$, the resultant $C_1$ of the vectors $A_1$ and $B_1$ is greater in amplitude by $\Delta C$ and has a phase difference of $\Delta\theta$.

Figure 3A:
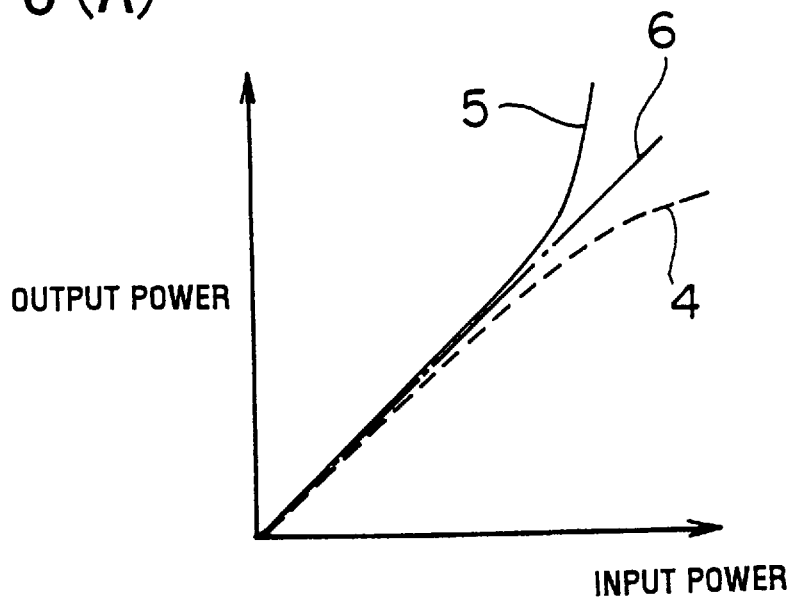
FIG. 3(A) is a graph illustrating compensation of an input power-to-output power characteristic.

It is assumed that the compensated circuit 1 has a nonlinear input power-to-output power characteristic as indicated by curve 4 in FIG. 3(A), for example. During large-signal operation, a parallel circuit composed of the aforementioned linear operating means 2 and nonlinear operating means 3 imparts the amplitude increment $\Delta C$, and therefore, the parallel circuit shows an input power-to-output power characteristic as indicated by curve 5 in FIG. 3(A). Accordingly, by connecting the compensated circuit 1 and the parallel circuit in series with each other, it is possible to compensate for the nonlinearity of the compensated circuit 1 and thus to obtain a post-compensation characteristic close to ideal line 6 in FIG. 3(A).

Figure 3B:
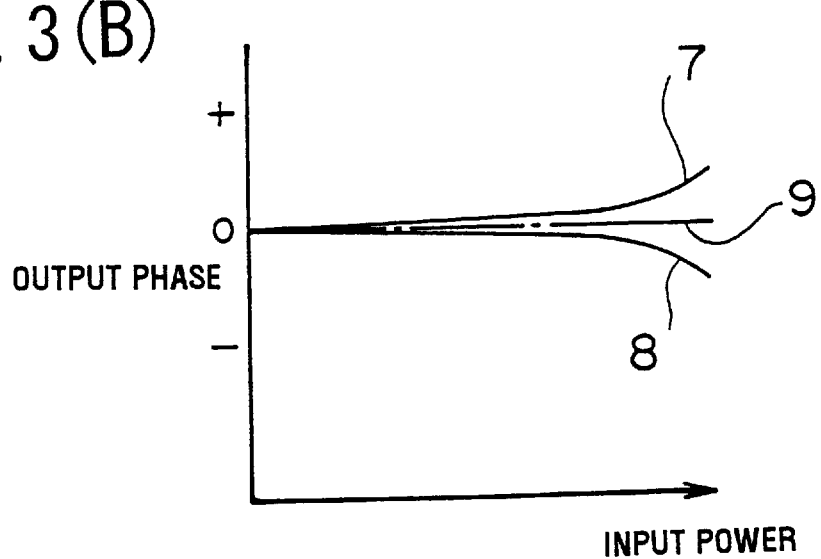
FIG. 3(B) is a graph illustrating compensation of an input power-to-output phase characteristic.

Let it also be assumed that the compensated circuit 1 has a nonlinear input power-to-output phase characteristic as indicated by curve 7 in FIG. 3(B), for example. During large-signal operation, the parallel circuit composed of the linear operating means 2 and the nonlinear operating means 3 provides the phase difference $\Delta\theta$; therefore, the parallel circuit exhibits an input power-to-output phase characteristic as indicated by curve 8 in FIG. 3(B). Accordingly, by connecting the compensated circuit 1 and the parallel circuit in series with each other, it is possible to compensate for the nonlinearity of the compensated circuit 1 and to obtain a post-compensation characteristic close to ideal line 9 in FIG. 3(B).

Details of an arrangement according to the first embodiment will be described with reference to FIGS. 4 through 7.

Figure 4:
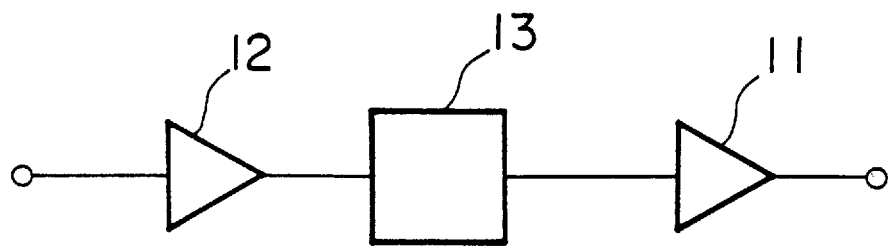
FIG. 4 is a block diagram showing an RF circuit of a radio transmitter provided with a nonlinear compensating circuit according to a first embodiment.

FIG. 4 is a block diagram showing an RF circuit of a radio transmitter provided with the nonlinear compensating circuit. Specifically, in the RF circuit which includes a power amplifier 11, a small-signal amplifier 12, etc., a compensating circuit 13 is arranged at a stage preceding the power amplifier 11. The power amplifier 11 corresponds to the compensated circuit 1 in FIG. 1.

Figure 5A:
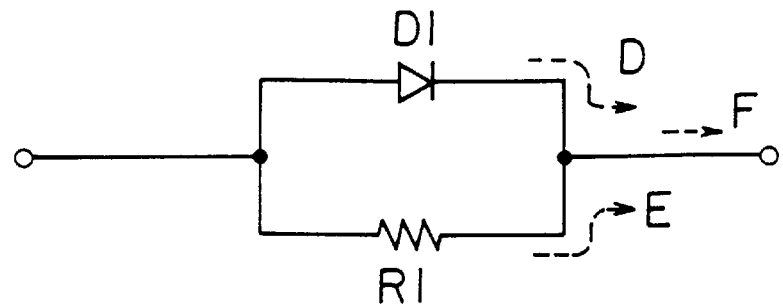
FIG. 5(A) is a circuit diagram showing the internal arrangement of the nonlinear compensating circuit according to the first embodiment.

FIG. 5(A) is a circuit diagram showing the internal arrangement of the compensating circuit 13. The compensating circuit 13 comprises a parallel circuit consisting of a diode D1 and a resistor R1. The diode D1 corresponds to the nonlinear operating means 3 in FIG. 1, and the resistor R1 corresponds to the linear operating means 2 in FIG. 1. For the diode D1, a Schottky barrier diode with a small ON-state voltage, in particular, is used, whereby nonlinear operation is available also when a small signal is input. In FIG. 5(A), symbols D, E and F represent, respectively, the vector of a signal which has passed through the diode D1, the vector of a signal which has passed through the resistor R1, and the vector of a composite signal which is a combination of the two signals and which is input to the power amplifier 11.

Figure 5B:
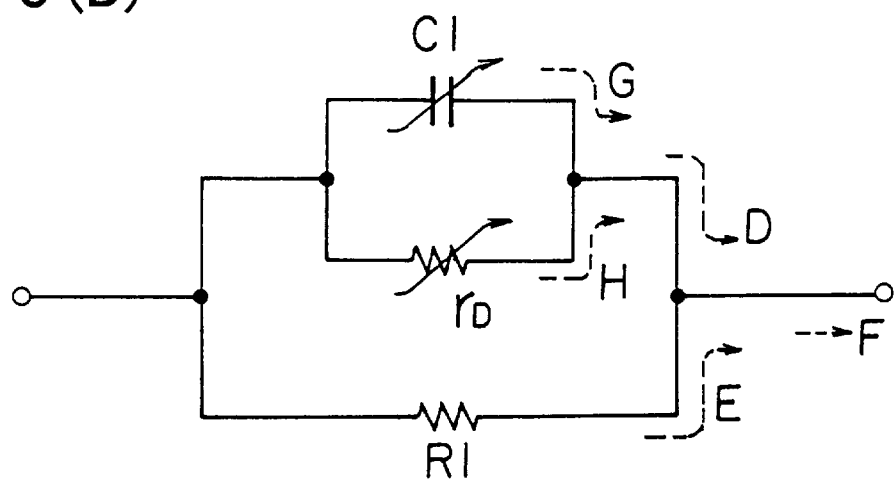
FIG. 5(B) is an equivalent circuit diagram of the nonlinear compensating circuit of the first embodiment.

FIG. 5(B) shows an equivalent circuit of the compensating circuit 13 in FIG. 5(A). Specifically, the diode D1 can be represented by a parallel circuit composed of a junction capacitance C1 and an internal resistance $r_D$. During large-signal operation, the junction capacitance C1 takes a slightly greater value than that during small-signal operation, whereas the internal resistance $r_D$ takes a significantly smaller value than that during small-signal operation. Here, let it be assumed that the vector of a signal which has passed through the junction capacitance C1 is G and that the vector of a signal which has passed through the internal resistance $r_D$ is H. It is further assumed that $D_0$, $E_0$, $F_0$, $G_0$ and $H_0$ respectively indicate the vectors D, E, F, G and H during small-signal operation and that $D_1$, $E_1$, $F_1$, $G_1$ and $H_1$ respectively indicate the vectors D, E, F, G and H during large-signal operation.

Figure 6:
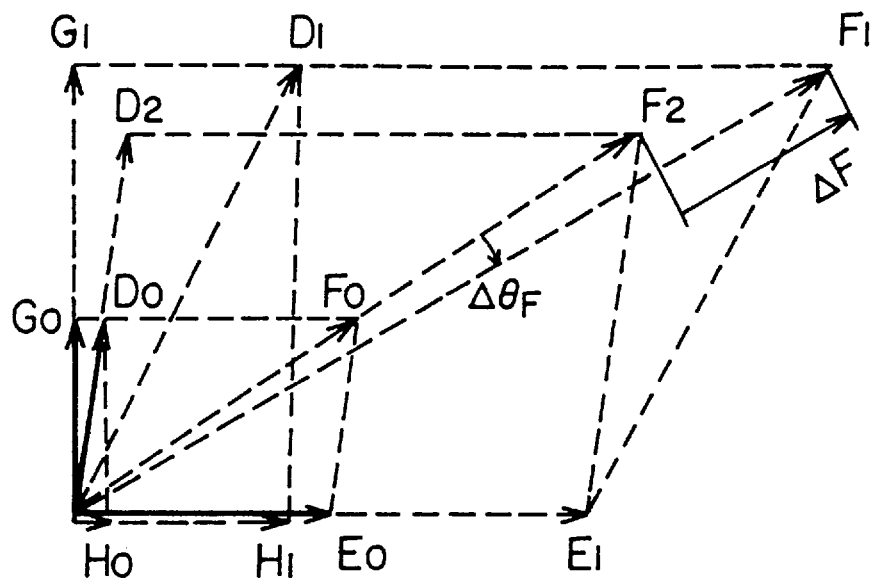
FIG. 6 is a vector diagram of the nonlinear compensating circuit of the first embodiment.

FIG. 6 is a vector diagram of the compensating circuit 13 shown in FIGS. 5(A) and 5(B). As shown in FIGS. 5(A) and 5(B), as the input signal increases in value, only the amplitude of the vector $E_0$ increases in proportion to the input signal up to the vector $E_1$ while the phase of the same vector remains unchanged. On the other hand, in the case of the vectors $G_0$ and $H_0$, their phases remain unchanged but their amplitudes undergo a nonlinear change. Symbol $D_2$ indicates a vector plotted on the assumption that the vector $D_0$ increases only in amplitude in proportion to (namely, linearly with respect to) the input signal while the phase thereof remains unchanged, and $F_2$ indicates the resultant vector of the vectors $D_2$ and $E_1$. Compared with the resultant vector $F_2$, the resultant vector $F_1$ of the vectors $D_1$ and $E_1$ is greater in amplitude by $\Delta F$ and has a phase difference of $\Delta\theta_F$.

Figure 7:
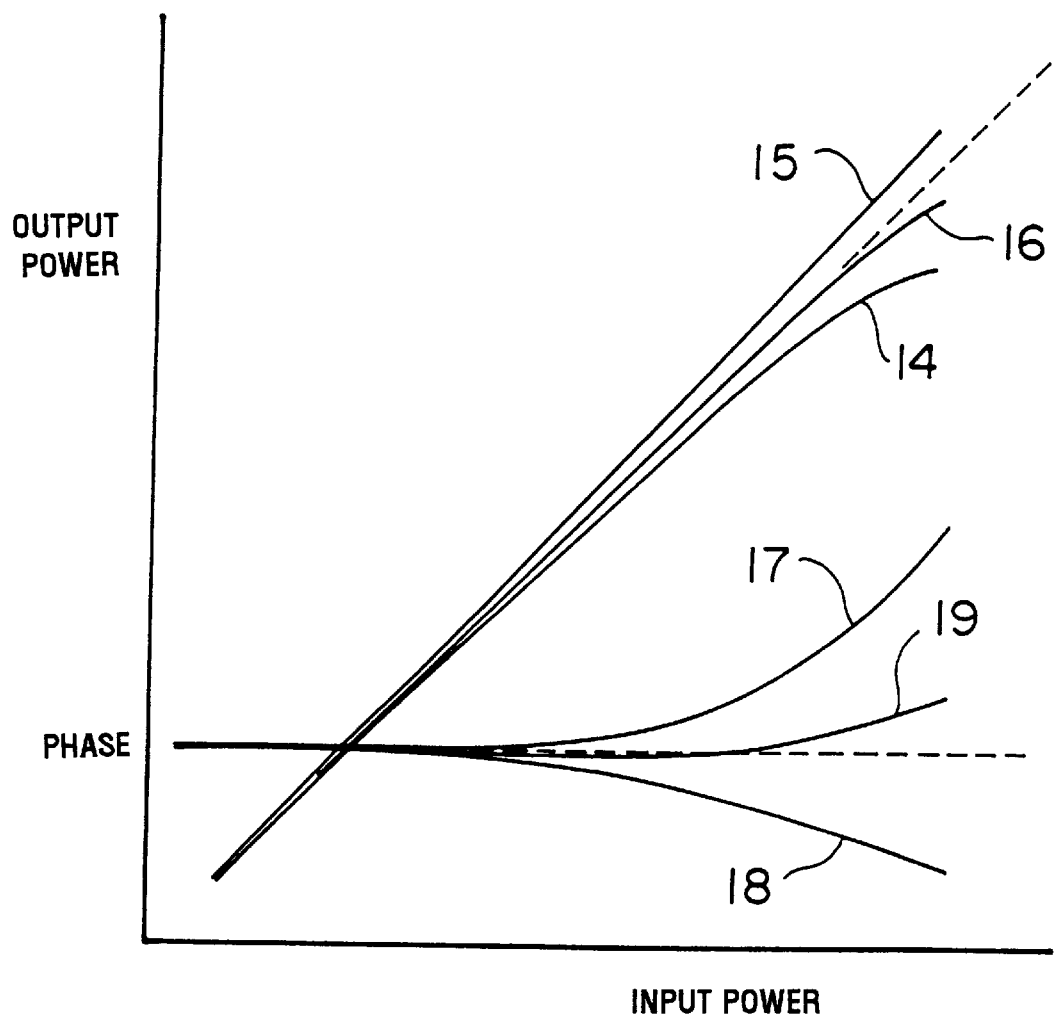
FIG. 7 is a graph showing characteristic data of an actual circuit according to the first embodiment.

FIG. 7 shows an example of actual operation of the power amplifier 11 of FIG. 4 which is used as a transmission power amplifier for a portable telephone, wherein the Schottky barrier diode "1SS283" is used as the diode D1 of the compensating circuit 13 shown in FIG. 5 and the resistance of the resistor R1 is 100 Ω. Specifically, provided the power amplifier 11 has an input power-to-output power characteristic indicated by curve 14, the compensating circuit 13 has an input power-to-output power characteristic indicated by curve 15, and since the compensating circuit 13 and the power amplifier 11 are connected in series with each other, a characteristic curve 16 close to an ideal linear characteristic (dashed line) can be obtained. Also, provided the power amplifier 11 has an input power-to-output phase characteristic indicated by curve 17, the compensating circuit 13 has an input power-to-output phase characteristic indicated by curve 18, and since the compensating circuit 13 and the power amplifier 11 are connected in series with each other, a characteristic curve 19 close to an ideal linear characteristic (dashed line) can be obtained.

By changing the resistance of the resistor R1 in FIGS. 5(A) and 5(B) which is connected in parallel with the diode D1, it is possible to vary the magnitudes of the vectors $E_0$ and $E_1$. It is, therefore, possible to vary the relationship between the resultant vectors $F_1$ and $F_2$, that is, the amplitude difference and the phase difference. Consequently, the characteristics of the compensating circuit 13 can be set in accordance with the characteristics of the power amplifier 11.

In the first embodiment, a Schottky barrier diode is used as the diode D1, but an ordinary diode whose internal resistance has a nonlinear characteristic may be used instead.

A second embodiment will be now described. The arrangement according to the second embodiment is basically identical with that of the first embodiment; namely, the second embodiment is identical in arrangement with the first embodiment shown in FIG. 4 but differs therefrom in the internal arrangement of the compensating circuit 13. Therefore, in the following description of the second embodiment, reference should also be made to the arrangement shown in FIG. 4.

FIG. 8(A) is a circuit diagram showing the internal arrangement of a compensating circuit according to the second embodiment. The compensating circuit comprises a parallel circuit composed of an FET (field-effect transistor) Q1 and a capacitor C2. The FET Q1 corresponds to the nonlinear operating means 3 in FIG. 1 and the capacitor C2 corresponds to the linear operating means 2 in FIG. 1. The FET Q1 has a source and a drain connected to the input and output sides, respectively, and has a gate grounded. The FET Q1 has a property that its source-drain resistance $r_{SD}$ varies in accordance with electric power applied between the source and the gate, thereby achieving nonlinear operation. In FIG. 8(A), J, I and K respectively indicate the vector of a signal which has passed through the FET Q1, the vector of a signal which has passed through the capacitor C2, and the vector of a composite signal which is a combination of the two signals and which is input to the power amplifier 11.

Figure 8:
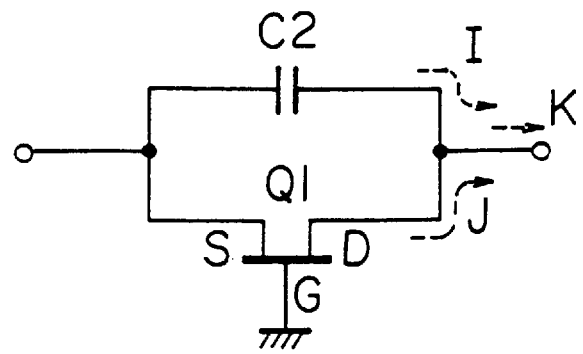
FIG. 8(A) is a circuit diagram showing the internal arrangement of a nonlinear compensating circuit according to a second embodiment.
FIG. 8(B) is an equivalent circuit diagram of the nonlinear compensating circuit of the second embodiment.
Figure 8:
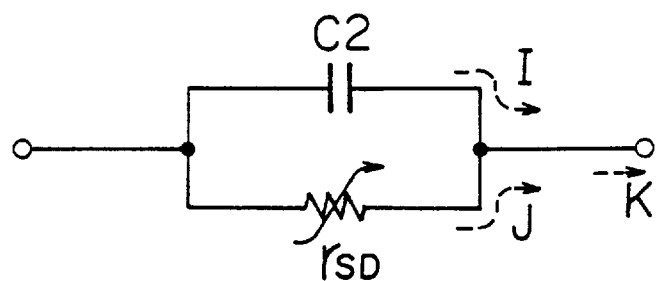

FIG. 8(B) shows an equivalent circuit of the compensating circuit shown in FIG. 8 (A). Specifically, the FET Q1 can be represented by the source-drain resistance $r_{SD}$. During large-signal operation, the source-drain resistance $r_{SD}$ takes a significantly smaller value than that during small-signal operation. It is assumed that $I_0$, $J_0$ and $K_0$ respectively indicate the vectors I, J and K during small-signal operation and that $I_1$, $J_1$ and $K_1$ respectively indicate the vectors I, J and K during large-signal operation.

Figure 9:
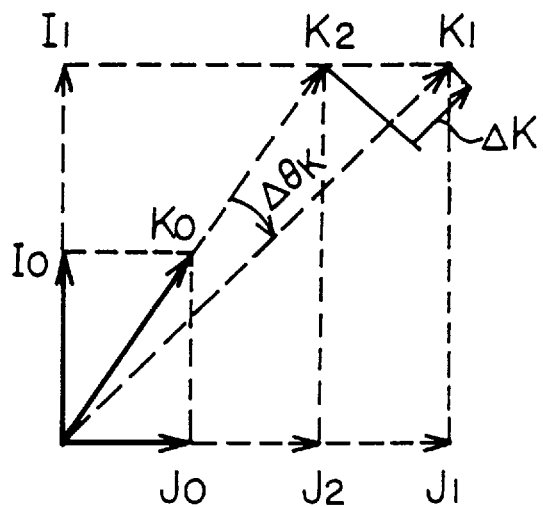
FIG. 9 is a vector diagram of the nonlinear compensating circuit of the second embodiment.

FIG. 9 is a vector diagram of the compensating circuit shown in FIG. 8. As shown in FIG. 8(B), as the input signal increases in value, only the amplitude of the vector $I_0$ increases in proportion to the input signal up to the vector $I_1$ while the phase of the same vector remains unchanged. On the other hand, in the case of the vector $J_0$, its phase remains unchanged but its amplitude undergoes a nonlinear increase and becomes the vector $J_1$. Symbol $J_2$ indicates a vector plotted on the assumption that the vector $J_0$ increases in amplitude in proportion to (namely, linearly with respect to) the input signal, and $K_2$ indicates the resultant of the vectors $J_2$ and $I_1$. Compared with the resultant vector $K_2$, the resultant $K_1$ of the vectors $I_1$ and $J_1$ is greater in amplitude by $\Delta K$ and has a phase difference of $\Delta\theta_K$.

A third embodiment will be now described. The arrangement according to the third embodiment is basically identical with that of the first embodiment; namely, the third embodiment is identical in arrangement with the first embodiment shown in FIG. 4 but differs therefrom in the internal arrangement of the compensating circuit 13. Therefore, in the following description of the third embodiment, reference should be made also to the arrangement shown in FIG. 4.

Figure 10:
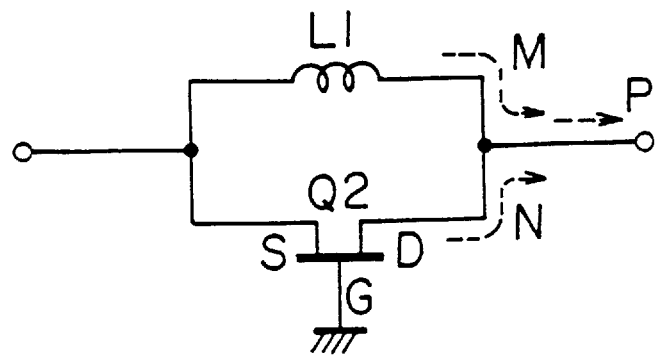
FIG. 10(A) is a circuit diagram showing the internal arrangement of a nonlinear compensating circuit according to a third embodiment.
FIG. 10(B) is an equivalent circuit diagram of the nonlinear compensating circuit of the third embodiment.
Figure 10:
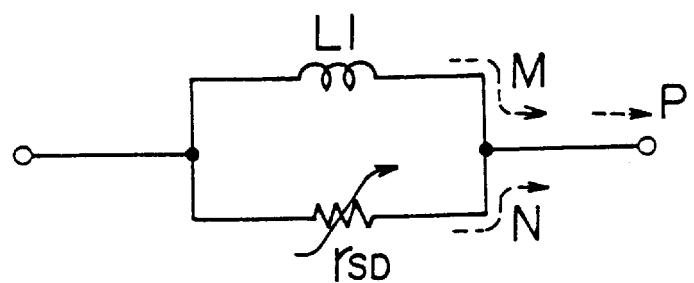

FIG. 10(A) is a circuit diagram showing the internal arrangement of a compensating circuit according to the third embodiment. The compensating circuit comprises a parallel circuit composed of an FET (field-effect transistor) Q2 and a coil L1. The FET Q2 corresponds to the nonlinear operating means 3 in FIG. 1 and the coil L1 corresponds to the linear operating means 2 in FIG. 1. As in the second embodiment, the FET Q2 has a source and a drain connected to the input and output sides, respectively, and has a gate grounded. The source-drain resistance $r_{SD}$ of the FET Q2 varies in accordance with electric power applied between the source and the gate. In FIG. 10 (A), N, M and P respectively indicate the vector of a signal which has passed through the FET Q2, the vector of a signal which has passed through the coil L1, and the vector of a composite signal which is a combination of the two signals and which is input to the power amplifier 11.

FIG. 10(B) shows an equivalent circuit of the compensating circuit shown in FIG. 10(A). Specifically, the FET Q2 can be represented by the source-drain resistance $r_{SD}$. During large-signal operation, the source-drain resistance $r_{SD}$ takes a significantly smaller value than that during small-signal operation. It is assumed that $M_0$, $N_0$ and $P_0$ respectively indicate the vectors M, N and P during small-signal operation and that $M_1$, $N_1$ and $P_1$ respectively indicate the vectors M, N and P during large-signal operation.

Figure 11:
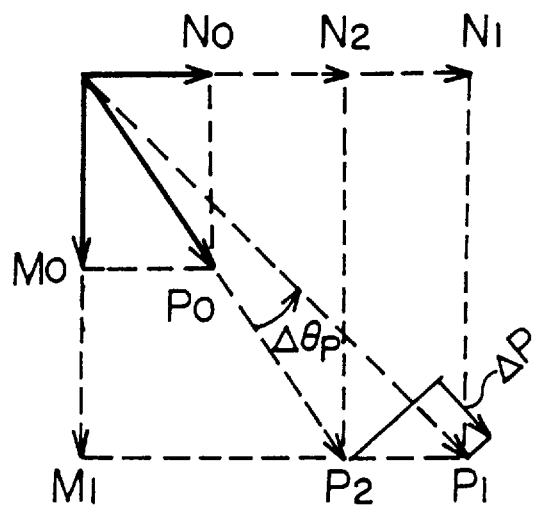
FIG. 11 is a vector diagram of the nonlinear compensating circuit of the third embodiment.

FIG. 11 is a vector diagram of the compensating circuit shown in FIGS. 10(A) and 10(B). As shown in FIG. 11, as the input signal increases in value, only the amplitude of the vector $M_0$ increases in proportion to the input signal up to the vector $M_1$ while the phase of the same vector remains unchanged. On the other hand, in the case of the vector $N_0$, its phase remains unchanged but its amplitude undergoes a nonlinear increase and becomes the vector $N_1$. Symbol $N_2$ indicates a vector plotted on the assumption that the vector $N_0$ increases in amplitude in proportion to (namely, linearly with respect to) the input signal, and $P_2$ indicates the resultant of the vectors $N_2$ and $M_1$. Compared with the resultant vector $P_2$, the resultant $P_1$ of the vectors $M_1$ and $N_1$ is greater in amplitude by $\Delta P$ and has a phase difference of $\Delta\theta_P$. In particular, the direction in which the phase difference $\Delta\theta_P$ takes place is opposite to that of the first and second embodiments. Therefore, the third embodiment is especially useful in cases where the direction in which the phase of the power amplifier 11 deviates during large-signal operation is opposite to that of the first and second embodiments.

In the first through third embodiments, a resistor, a capacitor or a coil is singly used as the nonlinear operating means 3, but two or more of these elements may be combined to constitute a parallel or series circuit serving as the nonlinear operating means 3.

A fourth embodiment will be now described.

Figure 12:
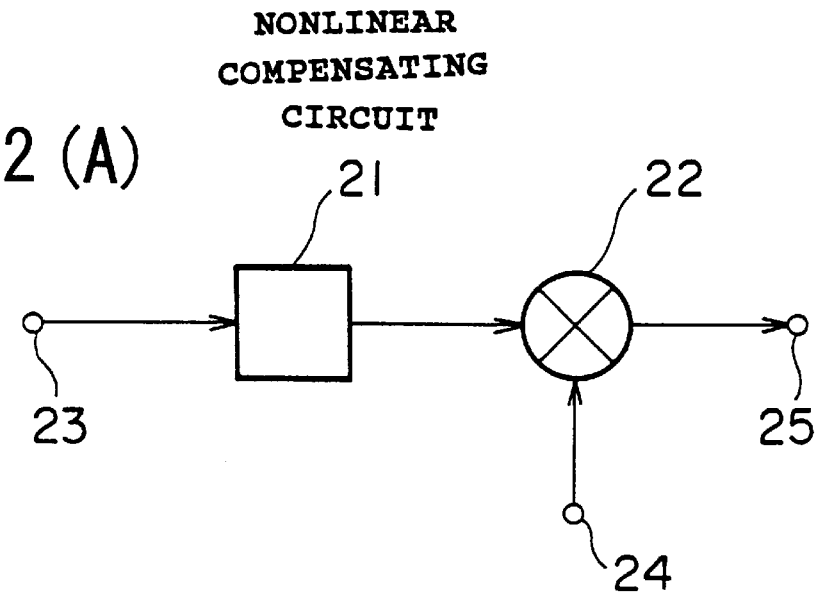
FIG. 12(A) is a first block diagram showing a frequency converting circuit of a radio transmitter provided with a nonlinear compensating circuit according to a fourth embodiment.
FIG. 12(B) is a second block diagram showing a frequency converting circuit of a radio transmitter provided with the nonlinear compensating circuit of the fourth embodiment.
Figure 12:
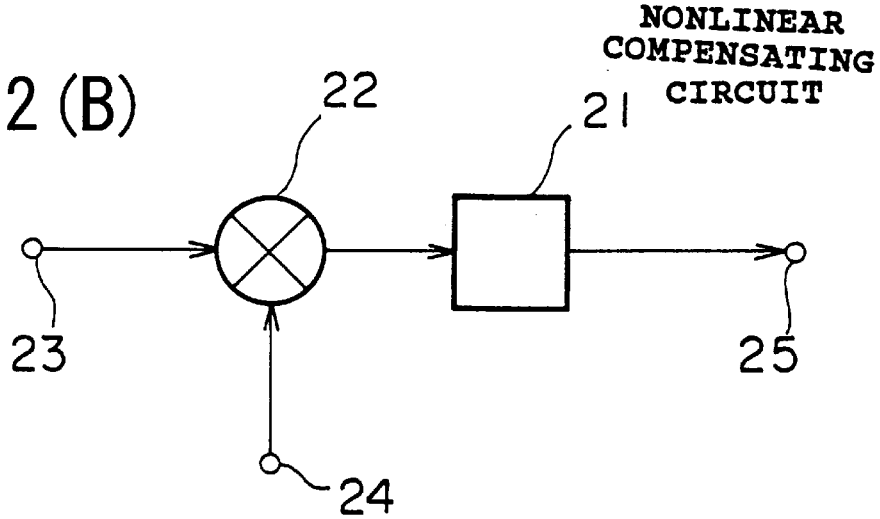

FIGS. 12(A) and 12(B) are each a block diagram showing a frequency converting circuit of a radio transmitter provided with a nonlinear compensating circuit. In the fourth embodiment, a nonlinear compensating circuit 21 is provided for the frequency converting circuit. In the frequency converting circuit for a radio transmitter shown in FIG. 12(A), a terminal 23 is supplied with an IF signal, a terminal 24 is supplied with a local oscillation signal, and a mixer 22 performs frequency conversion and outputs an RF signal from a terminal 25. As in the power amplifier mentioned with reference to the first to third embodiments, there is a nonlinearity between the IF signal input to the frequency converting circuit and the RF signal output from the same circuit. Therefore, the nonlinear compensating circuit 21 is arranged on the input side of the frequency converting circuit as shown in FIG. 12(A), or is arranged on the output side of the frequency converting circuit as shown in FIG. 12(B). The nonlinear compensating circuit 21 has an internal arrangement identical with that of the compensating circuit according to the first, second or third embodiment.

A fifth embodiment will be now described.

Figure 13:
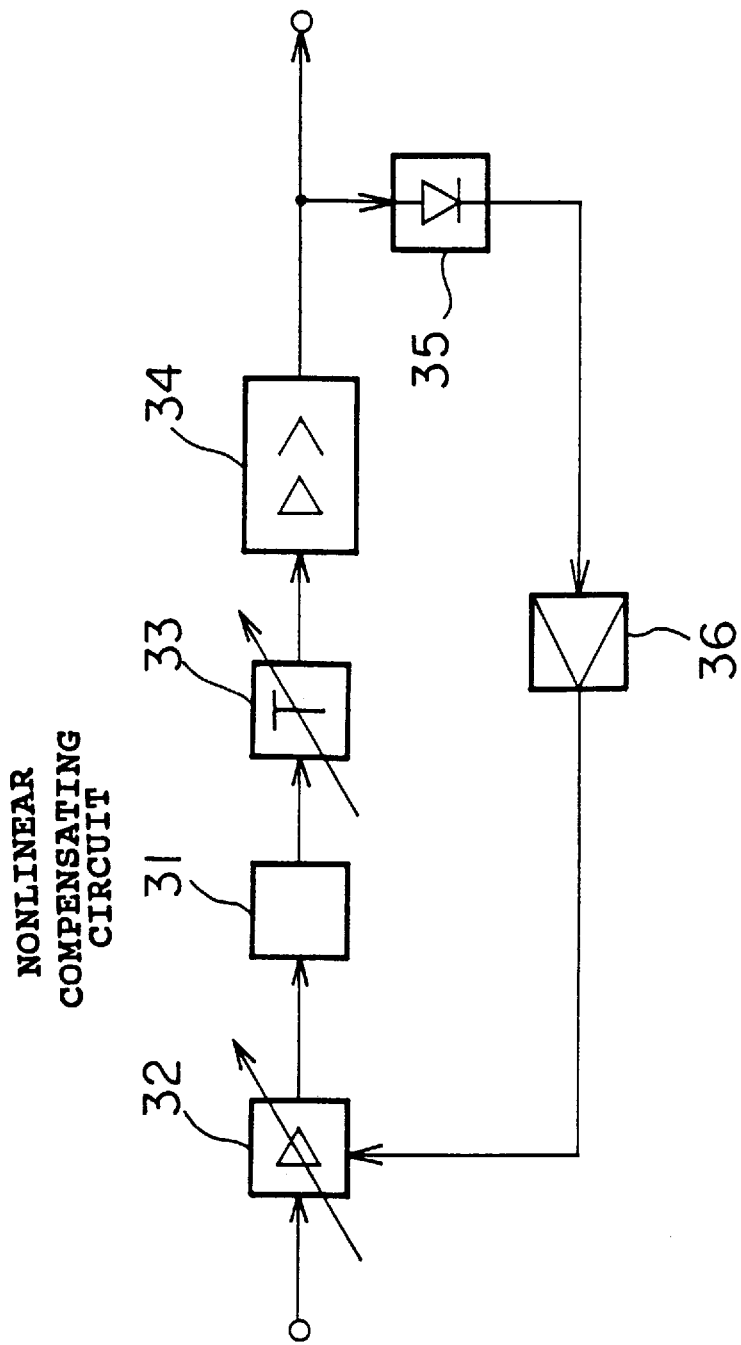
FIG. 13 is a block diagram showing an RF circuit of a radio transmitter provided with a nonlinear compensating circuit according to a fifth embodiment.

FIG. 13 is a block diagram showing an RF circuit of a radio transmitter provided with a nonlinear compensating circuit. In the fifth embodiment, the RF circuit of the radio transmitter includes an automatic level control (ALC) circuit. Specifically, the output of a power amplifier 34 is detected by a detector 35 to obtain a direct-current voltage corresponding to the output level of the power amplifier 34, and this direct-current voltage is amplified by a direct-current amplifier 36 and fed back to a variable gain amplifier 32. The variable gain amplifier 32 adjusts the gain so that the output of the power amplifier 34 may be constant, and the output of the variable gain amplifier 32 is supplied to the power amplifier 34 through a variable attenuator 33. A nonlinear compensating circuit 31 is arranged between the variable gain amplifier 32 and the variable attenuator 33. The nonlinear compensating circuit 31 has an internal arrangement identical with that of the compensating circuit according to the first, second or third embodiment. In this case, the power amplifier 34 is the compensated circuit. The nonlinear compensating circuit 31 operates in the same manner as described with reference to the first to third embodiments.

The variable attenuator 33 is used to match the operation level of the power amplifier 34 with that of the nonlinear compensating circuit 31. In this RF circuit, the output level of the power amplifier 34 is controlled to a constant level even in the case where the quantity of attenuation of the variable attenuator 33 is changed, thus facilitating the matching of the operation levels of the nonlinear compensating circuit 31 and power amplifier 34 with each other. The variable attenuator 33 may be omitted from the circuit arrangement shown in FIG. 13 to thereby simplify the structure.

As described above, according to the present invention, a parallel circuit composed of linear operating means, which performs a linear operation, and nonlinear operating means, which performs a nonlinear operation, is connected in series with a compensated circuit, whereby the nonlinear characteristic of the compensated circuit can be compensated for. Accordingly, the nonlinear compensating circuit of the present invention is simplified in structure, compared with the conventional pre-compensating circuit, is reduced in bulk and weight and inexpensive.

Therefore, where the present invention is used in combination with a power amplifier or the like of a radio apparatus arranged in a base station, the apparatus can be reduced in size and cost. Also, the present invention makes it possible to incorporate a nonlinear compensating circuit into a portable telephone, thus eliminating the problem of increased power consumption by a power amplifier etc.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A nonlinear compensating circuit for a radio apparatus, comprising:

a nonlinear circuit for which compensation is required; and compensating means for compensating for nonlinearity of said nonlinear circuit, said compensating means having linear operating means connected in series with said nonlinear circuit for performing a linear operation, and nonlinear operating means connected in parallel with said linear operating means for performing a nonlinear operation, said nonlinear operating means having a nonlinear input power-to-output power characteristic and a nonlinear input power-to-output signal phase characteristic, wherein said nonlinear operating means comprises a diode.

2. A nonlinear compensating circuit for a radio apparatus, comprising:

a nonlinear circuit for which compensation is required; and compensating means for compensating for nonlinearity of said nonlinear circuit, said compensating means having linear operating means connected in series with said nonlinear circuit for performing a linear operation, and nonlinear operating means connected in parallel with said linear operating means for performing a nonlinear operation, said nonlinear operating means having a nonlinear input power-to-output power characteristic and a nonlinear input power-to-output signal phase characteristic, wherein said nonlinear operating means comprises a diode and a resistor connected in parallel.

3. A nonlinear compensating circuit for a radio apparatus, comprising:

a nonlinear circuit for which compensation is required; and compensating means for compensating for nonlinearity of said nonlinear circuit, said compensating means having linear operating means connected in series with said nonlinear circuit for performing a linear operation, and nonlinear operating means connected in parallel with said linear operating means for performing a nonlinear operation, said nonlinear operating means having a nonlinear input power-to-output power characteristic and a nonlinear input power-to-output signal phase characteristic, wherein said nonlinear operating means comprises a capacitor.

4. A nonlinear compensating circuit for a radio apparatus, comprising:

a nonlinear circuit for which compensation is required; and compensating means for compensating for nonlinearity of said nonlinear circuit, said compensating means having linear operating means connected in series with said nonlinear circuit for performing a linear operation, and nonlinear operating means connected in parallel with said linear operating means for performing a nonlinear operation, said nonlinear operating means having a nonlinear input power-to-output power characteristic and a nonlinear input power-to-output signal phase characteristic, wherein said nonlinear circuit is a frequency converter of a radio communication apparatus, and a parallel circuit constituted by said linear operating means and said nonlinear operating means is connected in series with the frequency converter so as to precede the frequency converter.

5. A nonlinear compensating circuit for a radio apparatus, comprising:

a nonlinear circuit for which compensation is required; and compensating means for compensating for nonlinearity of said nonlinear circuit, said compensating means having linear operating means connected in series with said nonlinear circuit for performing a linear operation, and nonlinear operating means connected in parallel with said linear operating means for performing a nonlinear operation, said nonlinear operating means having a nonlinear input power-to-output power characteristic and a nonlinear input power-to-output signal phase characteristic, wherein said nonlinear circuit is a frequency converter of a radio communication apparatus, and a parallel circuit constituted by said linear operating means and said nonlinear operating means is connected in series with the frequency converter so as to follow the frequency converter.

6. A nonlinear compensating circuit for a radio apparatus of which a built-in circuit has a nonlinear input/output characteristic, comprising:

a nonlinear circuit for which compensation is required;

linear operating means connected in series with said nonlinear circuit for performing a linear operation; and nonlinear operating means connected in parallel with said linear operating means for performing a nonlinear operation, wherein said nonlinear circuit is a power amplifier inserted in a loop of an automatic level control circuit, and a parallel circuit constituted by said linear operating means and said nonlinear operating means is inserted in and series-connected with respect to the loop of the automatic level control circuit.

7. A nonlinear compensating circuit for a radio apparatus of which a built-in circuit has a nonlinear input/output characteristic, comprising:

a nonlinear circuit for which compensation is required;

linear operating means connected in series with said nonlinear circuit for performing a linear operation; and nonlinear operating means connected in parallel with said linear operating means for performing a nonlinear operation, wherein said nonlinear circuit includes a power amplifier in a loop of an automatic level control circuit including at least a variable gain amplifier, a variable attenuator and the power amplifier, and a parallel circuit constituted by said linear operating means and said nonlinear operating means is connected in series with and between the variable gain amplifier and the variable attenuator.

* * * * *

UNITED STATES PATENT AND TRADEMARK OFFICE
CERTIFICATE OF CORRECTION

PATENT NO. : 5,884,150
DATED : MARCH 16, 1999
INVENTOR(S) : Hideo SUGAWARA

It is certified that error appears in the above-indentified patent and that said Letters Patent is hereby corrected as shown below:

On the title page, Item [75], delete "Kawasaki" and insert --Kanagawa--.

Signed and Sealed this

Third Day of August, 1999

Attest:

Attesting Officer

Q. TODD DICKINSON

Acting Commissioner of Patents and Trademarks